United States Patent [19]
Ishii

[11] Patent Number: 5,750,423
[45] Date of Patent: May 12, 1998

[54] METHOD FOR ENCAPSULATION OF SEMICONDUCTOR DEVICES WITH RESIN AND LEADFRAME THEREFOR

[75] Inventor: Masaaki Ishii, Fukuoka, Japan

[73] Assignee: Dai-Ichi Seiko Co., Ltd., Japan

[21] Appl. No.: 519,588

[22] Filed: Aug. 25, 1995

[51] Int. Cl.⁶ .................................................. H01L 21/60
[52] U.S. Cl. .......................... 438/112; 438/124; 438/127
[58] Field of Search .................................. 437/205, 211, 437/212, 216, 217, 220; 257/676; 438/112, 117, 123, 124, 127

[56] References Cited

U.S. PATENT DOCUMENTS

| | | | |
|---|---|---|---|
| 4,612,564 | 9/1986 | Moyer | 257/676 |
| 4,633,583 | 1/1987 | Kato | 257/676 |
| 5,053,855 | 10/1991 | Michii et al. | 252/676 |
| 5,147,821 | 9/1992 | McShane et al. | 437/212 |
| 5,302,849 | 4/1994 | Cavasin | 257/676 |
| 5,367,766 | 11/1994 | Burns et al. | 437/211 |
| 5,512,781 | 4/1996 | Inoue | 257/676 |
| 5,527,743 | 6/1996 | Variot | 437/211 |

FOREIGN PATENT DOCUMENTS

A-19641  7/1992  Japan.

*Primary Examiner*—Kevin Picardat
*Attorney, Agent, or Firm*—Rothwell, Figg, Ernst & Kurz, P.C.

[57] ABSTRACT

A leadframes is provided with at least one supporting portion extending from an island thereof in the direction opposite to a surface on which a semiconductor chip is mounted, so that the supporting portion comes into contact with a bottom surface of a cavity of a mold for encapsulation of semiconductor chips with a resin when said mold is closed.

3 Claims, 3 Drawing Sheets

METHOD FOR ENCAPSULATION OF SEMICONDUCTOR DEVICES WITH RESIN AND LEADFRAME THEREFOR

BACKGROUND OF THE INVENTION

1. Field of the Invention

The present invention relates to a method for encapsulation of semiconductor devices with a thermosetting resin, and a leadframe used therefor.

2. Description of the Prior Art

Plastic molded semiconductor packages are commonly 2 to 3 mm thick, but the thickness of packages is steadily decreasing with the advance of semiconductor technology. For example, packages with 1.4 mm, 1.0 mm, and 0.8 mm thick have been developed. With the decrease in thickness of the packages, leadframes used for production of such semiconductor packages becomes thinner and the thickness of leadframes has decreased to 0.127 mm, and then to 0.08 mm.

However, use of such thin leadframes causes package warpage, short shots, or cracks of molding plastics because of weakened mechanical strength of the leadframes. In particular, if there is a difference in distance between spaces L and L' above and below the leadframe placed in a cavity of a mold, or if the leadframe has a downset island on which a semiconductor chip is mounted, as shown in FIG. 5, a molding material tends to flow into a larger space above the leadframe first, and then into the space below the leadframe, though this tendency is affected by a position of a gate through which the material is transferred into the cavity of the mold. Thus, the material fed into the upper space causes deformation of the leadframe toward downward. The greater the difference in distance between spaces above and below the leadframe, the greater is the deformation of the leadframe toward downward, resulting in package warpage, short shots, or cracks of the package.

SUMMARY OF THE INVENTION

It is therefore an object of the present invention to provide a method for encapsulation of semiconductor devices with a molding resin, which makes it possible to prevent leadframes from deformation during production of semiconductor packages.

Another object of the present invention is to provide a leadframe suitable for production of plastic molded semiconductor devices free from defects.

According to the present invention, these and other objects are achieved by providing a method for encapsulation of semiconductor devices with a molding resin, comprising the steps of loading leadframes with semiconductor chips into a mold so as to place semiconductor chips in cavities of the mold, said semiconductor chips being mounted on islands of said leadframes and wire-bonded to leads of said leadframes, and encapsulating said leadframes with semiconductor chips with a molten resin, characterized in that each of said leadframes is provided with at least one supporting portion extending from the island thereof in the direction opposite to a chip-mounted surface so that said at least one supporting portion comes into contact with a bottom surface of the cavity of said mold when said mold is closed.

Preferably, the supporting portion is generally made into a triangular shape, or a polygonal shape, or a semi-circular shape, or a semi-oval shape so that an exposed area of a free end thereof which appears on a surface of a molded semiconductor package, is minimized to avoid troubles due to exposure of moisture. If the leadframe is provided with rectangular islands, the supporting portion may be formed by bending four corners of each rectangular island in the direction opposite to a surface of the island on which a semiconductor chip is to be mounted.

According to the present invention it is possible to prevent the leadframe from deformation during encapsulation of semiconductor chips with a thermosetting resin since a pressure exerted on the island of the leadframe by transfer of the molding material is counterbalanced by the supporting portions rested on the bottom surface of the cavity.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
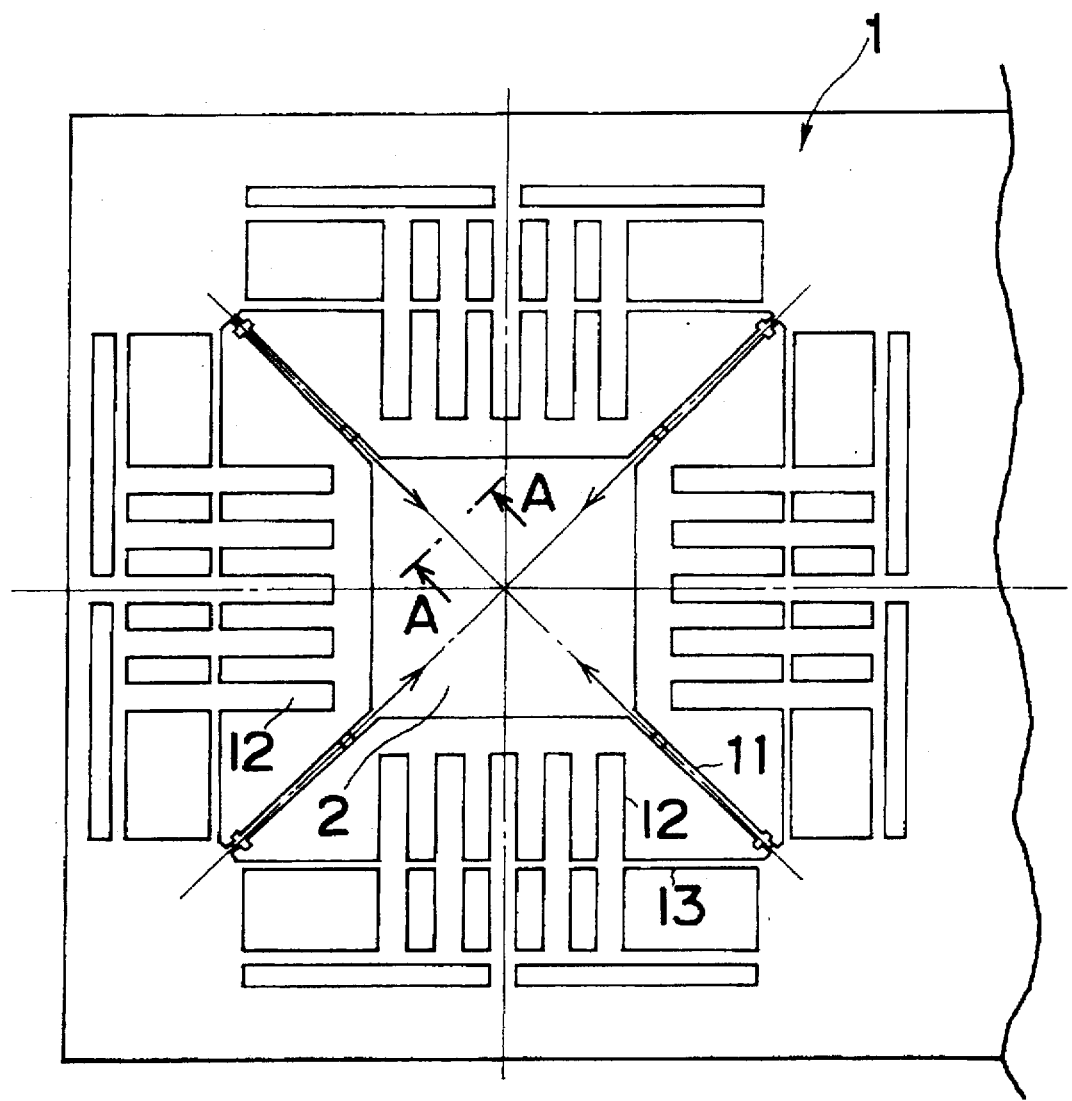
FIG. 1 is a plan view of a leadframe embodying the present invention.
Figure 2:
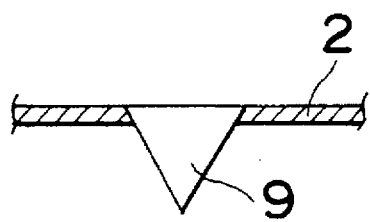
FIG. 2 is a sectional view of a leadframe taken along A—A line of FIG. 1.
Figure 3:
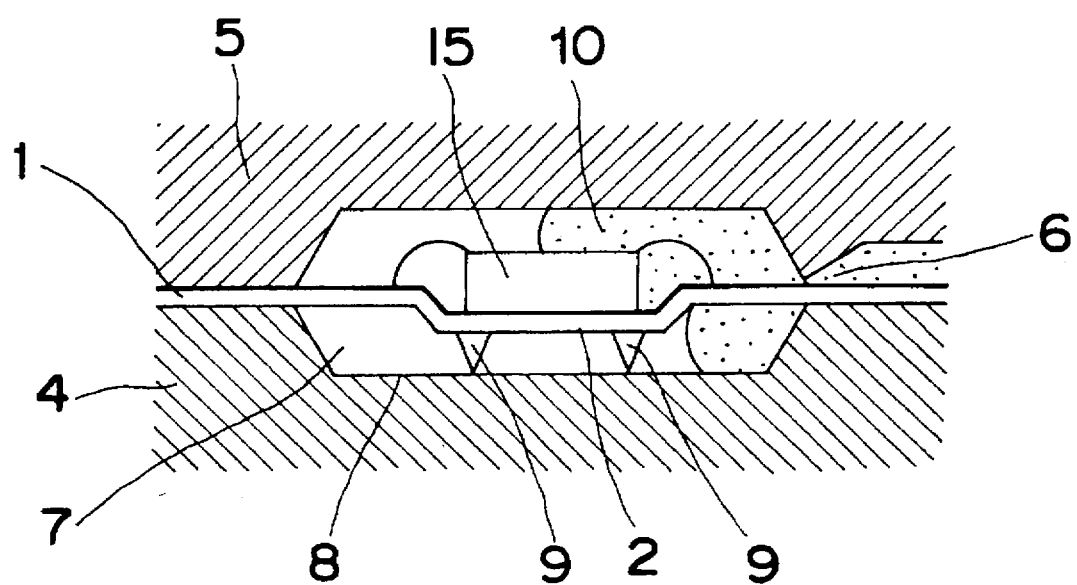
FIG. 3 is a cross sectional view illustrating a principle of transfer encapsulation of a semiconductor chip with a resin according to the present invention.

Referring now to FIG. 1, there is shown a leadframe 1 for resin molded semiconductor package. The leadframe 1 has an island 2 held by four tie bars 11, and a plurality of lead fingers 12 spaced one another and connected each other by dam bars 13. The island 2 is provided with four triangular supporting portions 9 extending downward, i.e., in the direction opposite to a chip-mounting surface of the island 2. A length of the supporting portions 9 is so designed that they come into contact with a bottom surface 8 of a cavity 7 of a mold when the mold is closed, as shown in FIG. 3.

The mold for encapsulation of semiconductors chips is a known multiple-cavity transfer mold comprising a pair of lower and upper mold sections 4 and 5, and the upper section 5 is provided with a gate 6 through which a thermosetting resin 10 is transferred to the cavity 7 by a plunger.

In use, a semiconductors chip 15 is mounted on the island 2 of the leadframe 1 and wire bonded to the lead fingers 12 of the leadframe 1. Using a loading frame, the leadframe loaded in a cavity of the lower mold section 4 and then clamped between the mold sections 4 and 5 by closing the mold, as shown in FIG. 3. When the mold is closed completely, the supporting portions 9 of the leadframe 1 are brought into contact with the bottom surface 8 of the lower mold section 4 as shown in FIG. 3. Then, a molten molding compound or a thermosetting resin 10 in a pot is transferred to the cavity 7 through the gate 6 by a transfer plunger. The resin 10 fills a space above the leadframe 1 first and then a space below the leadframe 1. The resin 10 fed into the upper space exerts a downward pressure on the leadframe 1, but the island 2 of the leadframe 1 is prevented from downward movement by the supporting portions 9 since a distance between the island 2 of the leadframe 1 and the bottom surface 8 of the cavity 7 is kept constant by the supporting portions 9 rested on the bottom surface 8 of the cavity 7. Since no deformation of the leadframe 1 occurs during molding, it is possible to prevent the resin molded semiconductor package from warpage, short-shots or cracking of the package.

After the cavity has been filled with the resin, the mold is held for a certain period of time for curing of the resin. After cure time has passed, the mold is opened and the molded semiconductor package is removed from the cavity.

Figure 4A:
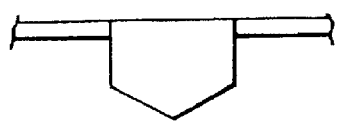
FIGS. 4A, 4B and 4C are sectional views similar to FIG. 2, illustrating modifications of a supporting portion of the leadframe as a polygon (FIG. 4A), semi-circular shape (FIG. 4B) or semi-oval shape (FIG. 4C)
Figure 4B:
Figure 4C:
Figure 5:
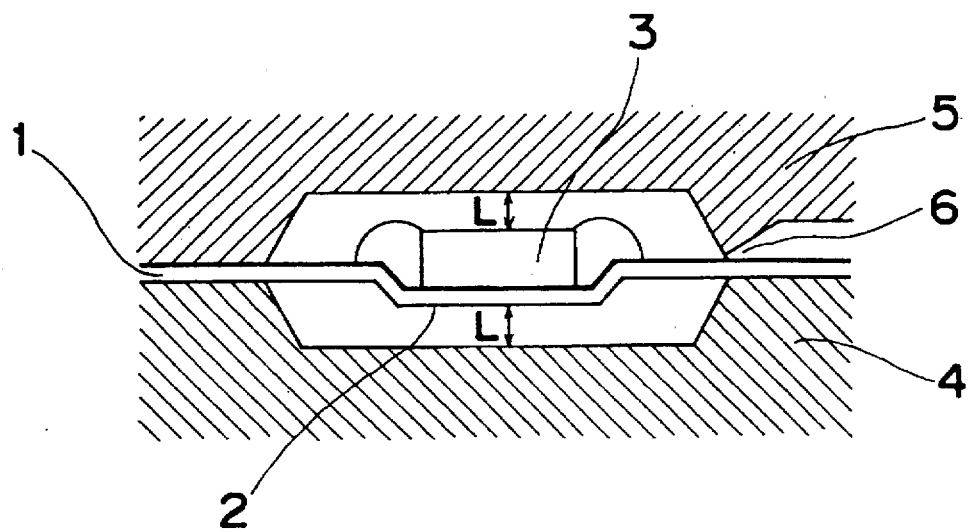
FIG. 5 is a cross sectional view of a cavity of a mold of the prior art for transfer encapsulation of a semiconductor chip with a resin.

In the above embodiment, the supporting portion is so designed as to have a triangular shape, but it may take any configurations such as, for example, as shown, respectively, in FIGS. 4A, 4B and 4C, as a polygon, a semi-circular shape, or a semi-oval shape, provided that an exposed area of a free end thereof which appears on a surface of a molded semiconductor package, can be minimized to avoid troubles due to exposure of moisture.

Further, the free ends of the supporting portion 9 may be bared to a great extent on the surface of the package to provide the semiconductor package with a heat radiating action.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for encapsulating semiconductor chips with a resin, comprising the steps of loading leadframes with semiconductor chips into a mold so as to place semiconductor chips in cavities of the mold, said semiconductor chips being mounted on islands of said leadframes and wire-bonded to leads of said leadframes, and encapsulating said semiconductor chips on rhe leadframe with a molten resin, characterized in that each of said leadframes is provided with at least one supporting portion extending from the island thereof in the direction opposite to a chip-mounted surface so that said at least one supporting portion comes into contact with a bottom surface of the cavity of said mold when said mold is closed, said at least one supporting portion being formed, by bending a part of said island, into a configuration such tht it comes into point-contact with the bottom surface of the mold when the mold is closed to minimize a surface area of the leadframe exposed out of the molded resin.

2. The method for encapsulation of semiconductor chips with a resin according to claim 1, wherein said at least one supporting portion has a configuration selected from the group consisting of a triangular shape, a polygon, semi-circle or a semi-oval.

3. The method for encapsulation of semiconductor chips with a resin according to claim 1, wherein said leadframe is provided with rectangular islands, and wherein said at least one supporting portion is formed by bending at least one corner of each of said rectangular islands in the direction opposite to a surface of the island on which said semiconductor chip is to be mounted.

* * * * *